United States Patent
Fuse et al.

(10) Patent No.: US 8,829,632 B2
(45) Date of Patent: Sep. 9, 2014

(54) SEMICONDUCTOR PACKAGE

(75) Inventors: Masayuki Fuse, Nagano (JP); Satoshi Matsuzawa, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 0 days.

(21) Appl. No.: 13/486,220

(22) Filed: Jun. 1, 2012

(65) Prior Publication Data
US 2012/0313203 A1    Dec. 13, 2012

(30) Foreign Application Priority Data

Jun. 10, 2011 (JP) ................. 2011-130536

(51) Int. Cl.
| H01L 31/0232 | (2006.01) |
| H01L 27/146 | (2006.01) |
| H01L 31/0203 | (2014.01) |

(52) U.S. Cl.
CPC ...... *H01L 27/14618* (2013.01); *H01L 31/0203* (2013.01)
USPC ................ 257/432; 257/434; 438/48; 438/65

(58) Field of Classification Search
CPC ............ H01L 31/0232; H01L 27/1461; H01L 31/02038

USPC .................... 257/432–434, E31.127, E31.11; 438/48, 65

See application file for complete search history.

(56) References Cited

U.S. PATENT DOCUMENTS

| 2006/0017128 A1* | 1/2006 | Harazono ..................... 257/433 |
| 2007/0091198 A1 | 4/2007 | Watanabe et al. |
| 2009/0046183 A1 | 2/2009 | Nishida et al. |
| 2009/0166784 A1* | 7/2009 | Honda .......................... 257/432 |

FOREIGN PATENT DOCUMENTS

| JP | S62-262445 | 11/1987 |
| JP | H04-070752 | 6/1992 |
| JP | H2004-070752 | 3/2004 |
| JP | 2010-141123 | 6/2010 |

* cited by examiner

*Primary Examiner* — Theresa T Doan
(74) *Attorney, Agent, or Firm* — Fish & Richardson P.C.

(57) ABSTRACT

A semiconductor package includes a wiring board, an electronic component mounted on the wiring board, and an enclosing frame arranged on an upper surface of the electronic component. The enclosing frame includes a basal portion, which has the form of a closed frame and extends along the upper surface of the electronic component, and an adhesion portion, which is wider than the basal portion and is arranged on the upper surface of the basal portion. A cap is adhered to an upper surface of the adhesion portion. A molding resin contacts a lower surface of the adhesion portion and seals the electronic component and the wiring board that are exposed from the enclosing frame.

17 Claims, 7 Drawing Sheets

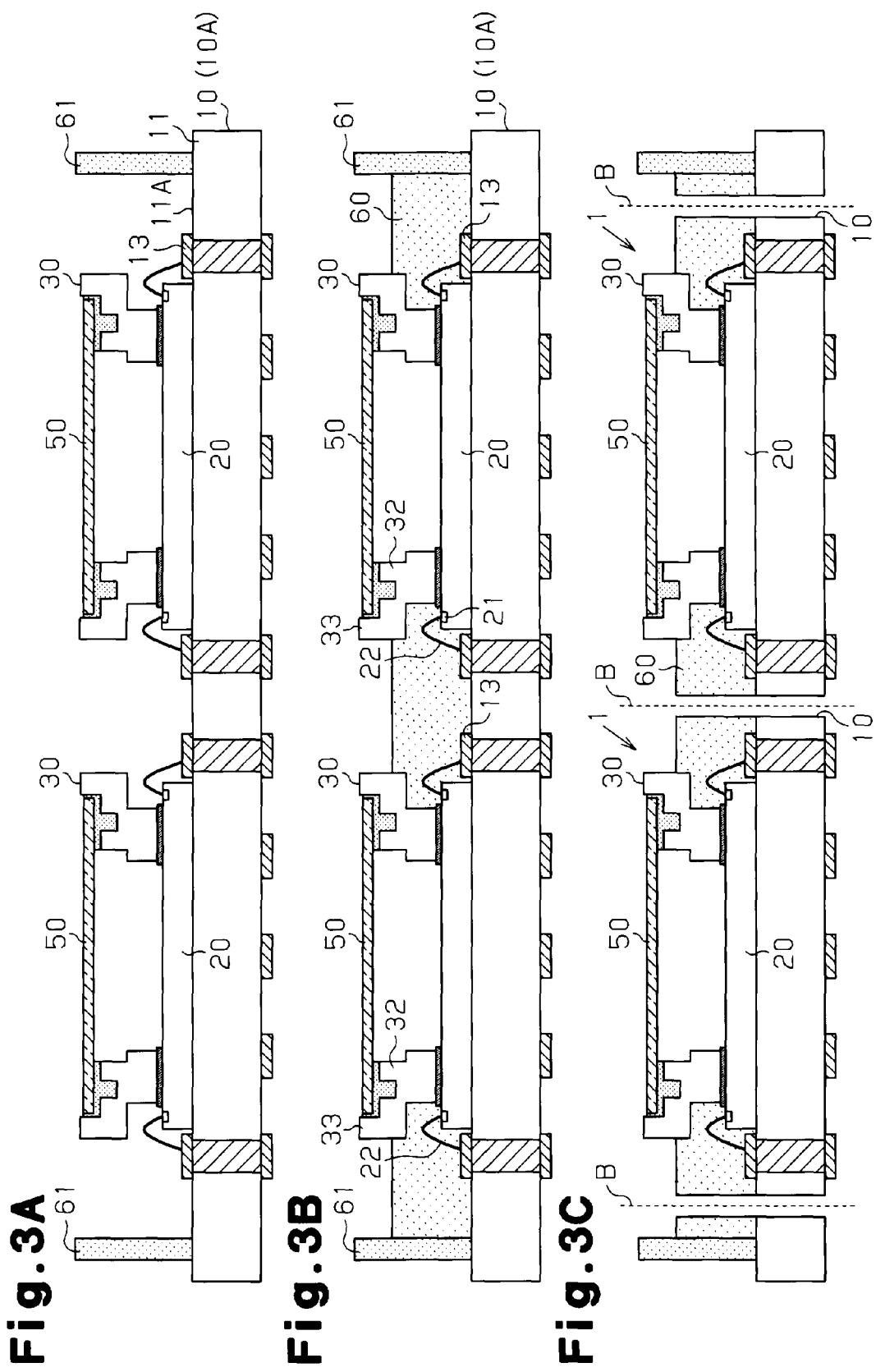

SEMICONDUCTOR PACKAGE

CROSS-REFERENCE TO RELATED APPLICATIONS

This application is based upon and claims the benefit of priority from prior Japanese Patent Application No. 2011-130536, filed on Jun. 10, 2011, the entire contents of which are incorporated herein by reference.

FIELD

The present invention relates to a semiconductor package.

BACKGROUND

Japanese Laid-Open Patent Publication No. 2010-141123 describes a camera module that forms a camera unit of a mobile terminal.

FIG. 10 illustrates the cross-sectional structure of a semiconductor package used in a camera module of the prior art. A wiring board 70 includes a wiring layer 71. An imaging element 80 is mounted on the wiring board 70. The imaging element 80 includes an upper surface defining a light reception surface. The imaging element 80 includes connection pads 81, which are connected by wires 82 to the wiring layer 71 of the wiring board 70.

An enclosing frame 90, which is fixed to the wiring board 70, encloses the imaging element 80. A frame-shaped adhesion portion 91 projects inward from an inner surface of the enclosing frame 90. A glass cap 100 is adhered by an adhesive agent 92 to the adhesion portion 91 of the enclosing frame 90. A sealed void S10, which is surrounded by the wiring board 70, the enclosing frame 90, and the glass cap 100, accommodates the imaging element 80. This prevents dust or the like from collecting on the imaging element 80.

However, the structure that entirely accommodates the imaging element 80 in the sealed void S10, which is formed by the wiring board 70, the enclosing frame 90, and the glass cap 100, enlarges the semiconductor package. It is difficult to apply a semiconductor package having such a structure to camera modules that have been miniaturized.

SUMMARY

One aspect of the present invention is a semiconductor package including a wiring board, an electronic component mounted on the wiring board, and an enclosing frame arranged on an upper surface of the electronic component. The enclosing frame includes a basal portion, which has the form of a closed frame and extends along the upper surface of the electronic component, and an adhesion portion, which is wider than the basal portion and is arranged on the upper surface of the basal portion. A cap is adhered to an upper surface of the adhesion portion. A molding resin contacts a lower surface of the adhesion portion and seals the electronic component and the wiring board that are exposed from the enclosing frame.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 2A to 2E and 3A to 3C are schematic cross-sectional views illustrating the procedures for manufacturing the semiconductor package;

DESCRIPTION OF EMBODIMENTS

One embodiment of the present invention will now be described with reference to the accompanying drawings. The accompanying drawings schematically illustrate structures and do not depict actual scale.

Figure 1A:
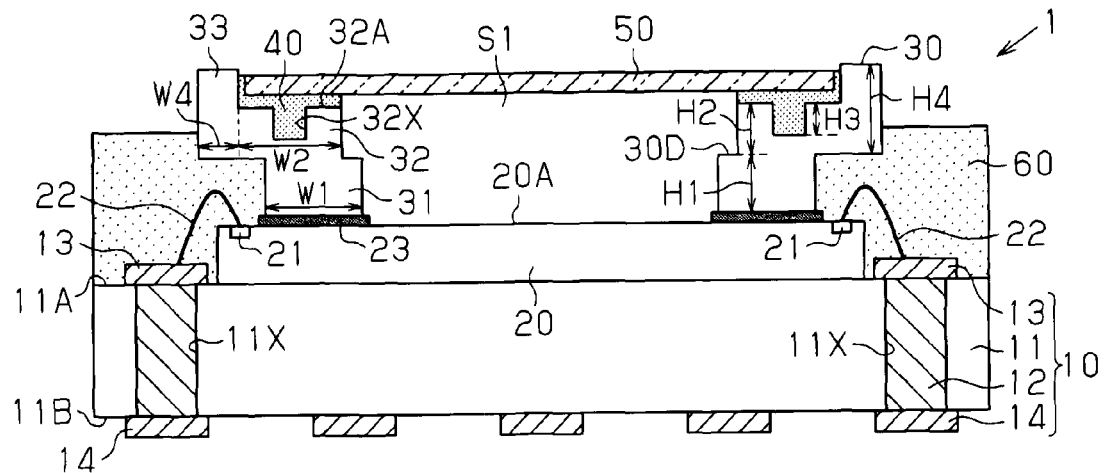
FIG. 1A is a schematic cross-sectional view illustrating a semiconductor package according to one embodiment of the present invention.

A semiconductor package 1 of the present embodiment is applied to a camera module. As illustrated in FIG. 1A, the semiconductor package 1 includes a wiring board 10, an imaging element 20, an enclosing frame 30, and a cap 50. The imaging element 20 is mounted on the wiring board 10. The enclosing frame 30 is fixed to the imaging element 20. The cap 50 is fixed to the enclosing frame 30.

The wiring board 10 includes a substrate 11, through electrodes 12, and wiring patterns 13 and 14. The through electrodes 12 extend through the substrate 11 in a thicknesswise direction. The substrate 11 may be made of, for example, glass epoxy. The substrate 11 includes through holes 11X formed at certain locations (two locations in FIG. 2A). Each through hole 11X extends from a first surface 11A to a second surface 11B of the substrate 11.

The through electrodes 12 are respectively arranged in the through holes 11X. Both ends of each through electrode 12 are connected to the wiring patterns 13 and 14, respectively. The wiring pattern 13 is formed on the first surface 11A of the substrate 11 (i.e., the surface on which the imaging element 20 is mounted). The wiring pattern 14 is formed on the second surface 11B of the substrate 11 (i.e., the surface opposite to the surface on which the imaging element 20 is mounted). The through electrodes 12 electrically connect the wiring patterns 13 and 14 each other. The through electrodes 12 and the wiring patterns 13 and 14 may be made of a metal such as copper (Cu).

The imaging element 20 is fixed to the first surface 11A of the substrate 11 in a state in which its light reception surface (upper surface 20A) faces an upward direction. For example, a CMOS image sensor or a CCD image sensor may be used as the imaging element 20. The imaging element 20 includes connection pads 21 electrically connected by wires 22 to the wiring pattern 13 of the wiring board 10.

The enclosing frame 30 is fixed to the upper surface 20A of the imaging element 20. More specifically, the enclosing frame 30 is adhered by an adhesive agent 23 to the upper surface 20A of the imaging element 20. In detail, the imaging element 20 includes an effective pixel region A1 (refer to FIG. 1B) and an ineffective pixel region (e.g., optical black region), which is located outward from the effective pixel region A1. The enclosing frame 30 is adhered to the ineffective pixel region to encompass the effective pixel region A1, which is a region like a light reception portion that affects imaging performance. The enclosing frame 30 may be made of any insulative material that can be shaped into a desirable form and has sufficient strength. When a semiconductor package 1 is soldered to a mother board, it is preferable that the enclosing frame 30 be made of a material having a heat resistance of approximately 250° C. to 270° C. For example, the material of the enclosing frame 30 may be a resin such as polycarbonate (PC) or polyphenylene sulfide (PPS). Further, a thermosetting adhesive agent is used as the adhesive agent 23. An epoxy or urethane adhesive agent may be used as the thermosetting adhesive agent.

The enclosing frame 30 includes a basal portion 31 and an adhesion portion 32. The basal portion 31 has the form of a picture frame, or a closed frame, and includes a central opening. The basal portion 31 includes a bottom surface, which is adhered by the adhesive agent 23 to the imaging element 20. The adhesion portion 32 has the form of a closed frame and is wider than the basal portion 31. In the illustrated example, the enclosing frame 30 further includes an upright portion 33, which extends upward and along the periphery of the adhesion portion 32. The basal portion 31, the adhesion portion 32, and the upright portion 33 are molded (formed) integrally into a single component.

The basal portion 31 has, for example, a height H1 of 300 μm and a width W1 of 500 μm. The adhesion portion 32 is formed on an upper surface of the basal portion 31. Further, the adhesion portion 32 includes an inner surface located outward from that of the basal portion 31. The inner surfaces of the adhesion portion 32 and the basal portion 31 form a stepped portion 30D in an inner surface of the enclosing frame 30. More specifically, the basal portion 31 (also referred to as lower member) is projected inward relative to an inner edge of an upper surface 32A of the adhesion portion 32 to form the stepped portion 30D. An outer edge of the adhesion portion 32 is located outward relative to an outer surface of the basal portion 31. The adhesion portion 32 is set to have, for example, a height H2 of 200 μm and a width W2 of 600 μm. The stepped portion 30D may be referred to as an inner step. A step formed in an outer surface of the enclosing frame 30, that is, the step between the outer surface of the basal portion 31 and an outer surface of the upright portion 33, may be referred to as an outer step.

Figure 1B:
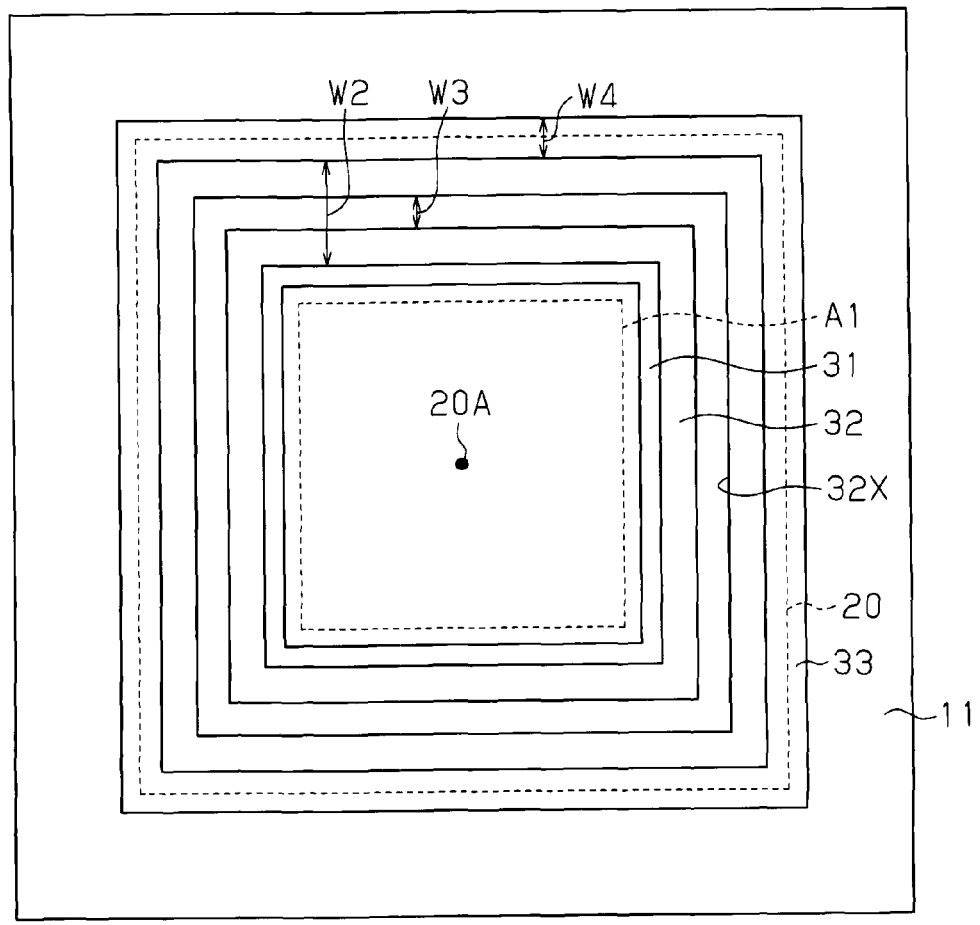
FIG. 1B is a schematic plan view illustrating the semiconductor package of FIG. 1A without a cap.

The upper surface 32A (adhesion surface) of the adhesion portion 32 includes a recess 32X. In the illustrated example, the recess 32X is formed in the adhesion portion 32 between the inner and outer edges of the upper surface 32A. Referring to FIG. 1B, the recess 32X has the form of a closed frame as viewed from above. The recess 32X is set to have, for example, a width W3 of 100 μm and a depth H3 of 100 μm.

Referring to FIG. 1A, the upright portion 33 entirely encompasses the periphery of the cap 50, which is adhered to the adhesion portion 32. The upright portion 33 is set to have, for example, a height H4 of 400 μm and a width W4 of 100 μm.

The cap 50 is adhered by an adhesive agent 40 to the upper surface 32A of the adhesion portion 32 in the enclosing frame 30. The adhesive agent 40 is applied to the upper surface 32A of the adhesion portion 32 and filled in the recess 32X. Further, the adhesive agent 40 may be applied between the upright portion 33 and the entire periphery of the cap 50. A thermosetting and ultraviolet (UV) curing adhesive agent may be used as the adhesive agent 40. An epoxy or acrylic adhesive agent may be used as such a thermosetting and UV curing adhesive agent.

The cap 50 may be a planar member such as a tetragonal glass sheet. The cap 50 may have a size of, for example 8 mm×6 mm. In a state in which the cap 50 is fixed to the enclosing frame 30, the cap 50 seals a void S1, which is formed by the imaging element 20, the enclosing frame 30, and the cap 50. The void S1 is isolated from ambient air. This prevents dust from collecting on the imaging element 20 (particularly, the effective image region A1) and prevents such dust from blocking the light entering the imaging element 20. The cap 50 also functions as an infrared (IR) cut filter that blocks the transmission of non-visible light, or IR light, while passing the visible light.

A molding resin 60 is formed on parts of the imaging element 20 and the wiring board 10 located outward from the enclosing frame 30. The molding resin 60 contacts the enclosing frame 30 at a lower surface of the adhesion portion 32 and a lower surface of the upright portion 33. More specifically, the molding resin 60 fills a gap between the lower surface of the adhesion portion 32 and the surfaces of the wiring board 10 and the imaging element 20. As a result, the enclosing frame 30 is adhered by the adhesive agent 23 to the imaging element 20 and supported by the molding resin 60. Further, the molding resin 60 seals the wiring pattern 13, the connection pads 21, the wires 22, and the like. The molding resin 60 may be made of, for example, an insulative resin, such as epoxy resin and polyimide resin. A potting process may be performed to form the molding resin 60 from a potting resin.

The operation of the semiconductor package 1 will now be described.

The enclosing frame 30 is arranged on the imaging element 20. Thus, there is no need to provide space for the enclosing frame 30 on the wiring board 10. This allows for the wiring board 10 to be reduced in size and thereby allows for the semiconductor package 1 to be miniaturized. Further, the gap between the lower surface of the adhesion portion 32 and the surfaces of the wiring board 10 and the imaging element 20 is filled by the molding resin 60. Additionally, the molding resin 60 and the adhesion of the basal portion 31 and the imaging element 20 with the adhesive agent 23 rigidly support the enclosing frame 30.

As a comparative example that rigidly supports the enclosing frame 30, projections projecting upward from two opposite ends of the wiring board 10 may support the enclosing frame 30 (adhesion portion 32). However, in this comparative example, the projections are formed outside the wiring pattern 13. This enlarges the wiring board 10 and, consequently, the semiconductor package. In contrast, in the semiconductor package 1 of the present embodiment, the molding resin 60 is formed in the gap between the lower surface of the adhesion portion 32 and the surfaces of the wiring board 10 and the imaging element 20. Thus, there is no need for enlargement of the wiring board 10 to rigidly support the enclosing frame 30. In addition, the enclosing frame 30 is supported by the molding resin 60, which covers at least the wires 22 and the wiring pattern 13 on the wiring board 10. Thus, there is no need to provide space for arranging an additional member for supporting the enclosing frame 30 at a location outward from the contour of the wiring pattern 13 on the wiring board 10. This suppresses enlargement of the semiconductor package 1 in a preferable manner.

The enclosing frame 30, which is a molded product, supports the cap 50 at a height distanced from the imaging element 20. Thus, by adjusting the height of the enclosing frame 30, the distance (air gap) from the upper surface 20A of the imaging element 20 to a lower surface of the cap 50 may be adjusted to the desired distance. This ensures a large air gap and decreases defects, such as scratches, smears, and foreign matter on the glass sheet forming the cap 50. As a result, the yield of the semiconductor package 1 can be improved.

The enclosing frame 30 includes the adhesion portion 32, which is arranged on the upper surface of the basal portion 31 and is wider than the basal portion. This increases the area of contact between the cap 50 and the adhesive agent 40 applied to the upper surface 32A of the adhesion portion 32.

The upper surface 32A of the adhesion portion 32 includes the recess 32X, which has the form of a closed frame. The adhesive agent 40 is applied to the upper surface 32A of the adhesion portion 32 and filled in the recess 32X. In this manner, by filling the adhesive agent 40 into the recess 32X, the adhesive agent 40 can be thickened. Thus, even when performing a heat treatment, such as the soldering of the semiconductor package 1 to the motherboard or the like, the thick adhesive agent 40 reduces thermal stress between the enclosing frame 30 and the cap 50. More specifically, elastic deformation of the adhesive agent 40 absorbs and reduces thermal stress generated by the difference in thermal expansion coefficients of the enclosing frame 30 and the cap 50. This suppresses bending and the like of the cap 50.

A method for manufacturing the semiconductor package 1 will now be discussed.

Figure 2A:
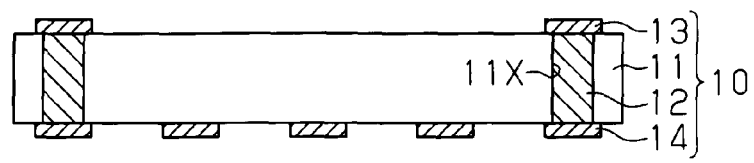

First, the wiring board 10 such as that illustrated in FIG. 2A is prepared. The wiring board 10 undergoes known processes to form the through holes 11X, the through electrodes 12, and the wiring patterns 13 and 14.

Figure 2B:
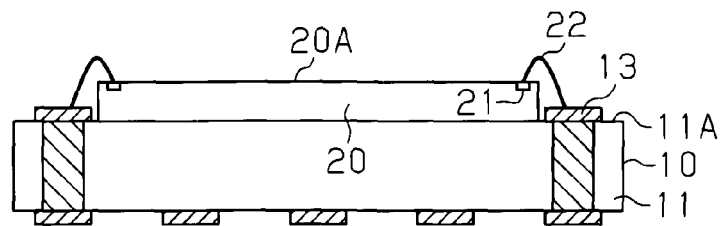

Referring to FIG. 2B, the imaging element 20, arranged in a state in which its light reception surface is facing upward, is mounted (die bonded) on the first surface 11A of the wiring board 10. Then, the connection pads 21 of the imaging element 20 are electrically connected (wire bonded) to the wiring pattern 13 of the wiring board 10.

Here, the enclosing frame 30 illustrated in FIG. 1 is prepared. The enclosing frame 30 is molded by, for example, filling a resin of polycarbonate or polyphenylene sulfide into a mold and quenching and hardening the resin. The enclosing frame 30 may also be formed through a printing process or the like. Further, the method for manufacturing the enclosing frame 30 is not limited as long as the enclosing frame 30 can be formed with any shape.

Figure 2C:
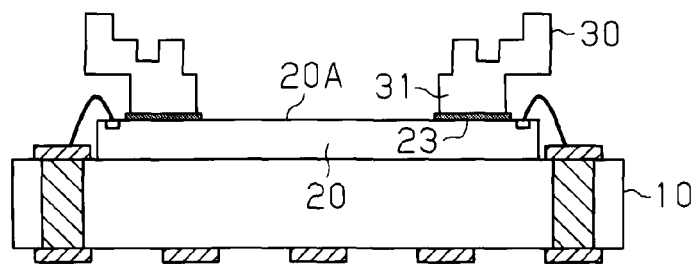

Then, referring to FIG. 2C, the thermosetting adhesive agent 23 is applied to the upper surface 20A of the imaging element 20 in the form of a closed frame along the contour (peripheral surface) of the imaging element 20. The adhesive agent 23 is applied so as not to spread into the effective pixel region A1 of the imaging element 20 (refer to FIG. 1B). The enclosing frame 30 is arranged on the adhesive agent 23. The bottom surface of the basal portion 31 of the enclosing frame 30 contacts the adhesive agent 23 on the imaging element 20. Next, a heat treatment is performed at a predetermined temperature (e.g., approximately 85°) to harden the adhesive agent 23. This adheres the enclosing frame 30 to the upper surface 20A of the imaging element 20.

Figure 2D:
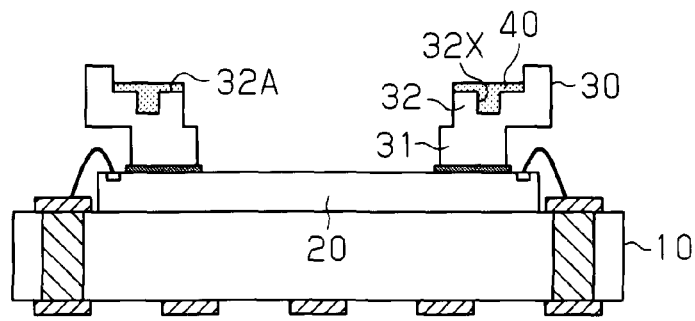

Referring to FIG. 2D, the UV curing or thermosetting adhesive agent 40 is filled in the recess 32X in the adhesion portion 32 of the enclosing frame 30. The adhesive agent 40 is also applied to the upper surface 32A of the adhesion portion 32.

Figure 2E:
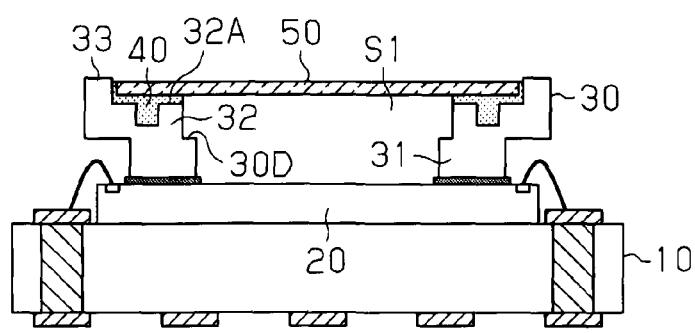

Referring to FIG. 2E, the cap 50, which is slightly smaller than the contour of the adhesion portion 32 in the enclosing frame 30, is prepared and arranged on the upper surface 32A of the adhesion portion 32. This seals the void S1, which is surrounded by the imaging element 20, the enclosing frame 30, and the cap 50, and isolates the effective pixel region A1 of the imaging element 20 in the void S1 from ambient air. When the cap 50 is arranged on the upper surface 32A of the adhesion portion 32, the adhesive agent 40 on the adhesion portion 32 is spread in a lateral direction of the adhesion portion 32. In this state, the upright portion 33 formed at the periphery of the adhesion portion 32 causes the adhesive agent 40, which has been spread in the lateral direction, to further spread in the vertical direction along the inner wall of the upright portion 33. This applies the adhesive agent 40 to between the upright portion 33 and the cap 50. Further, the basal portion 31 projects inward from the inner surface of the adhesion portion 32 to form the stepped portion 30D below the inner surface of the adhesion portion 32. This prevents the adhesive agent 40, which has been spread in the lateral direction, from falling onto the imaging element 20.

Next, the adhesive agent 40 is partially hardened when irradiated with UV light and then completely hardened when undergoing a heat treatment under a predetermined temperature (e.g., approximately 85° C.). This adheres the cap 50 to the upper surface 32A of the adhesion portion 32 and prevents the cap 50 from being lifted when the air in the void S1 expands. Here, the adhesive agent 40 is applied between the upright portion 33 and the cap 50 in addition to the upper surface 32A of the adhesion portion 32. This rigidly adheres the cap 50 to the enclosing frame 30.

Figure 4A:
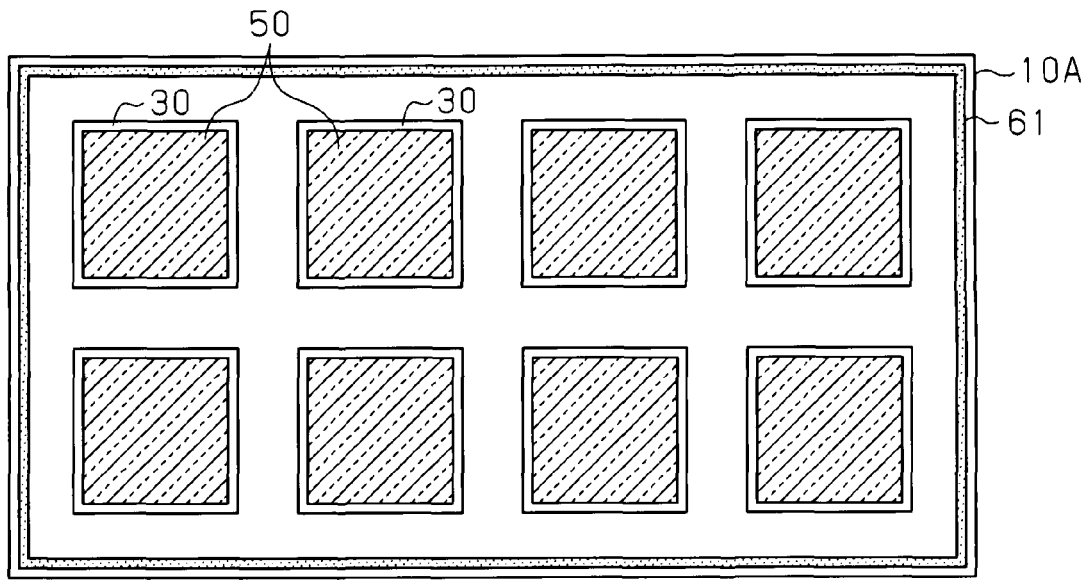
FIGS. 4A and 4B are schematic plan views illustrating the procedures for manufacturing the semiconductor package.

Then, referring to FIG. 3A, a dam 61 is formed on the first surface 11A of the substrate 11 at a location outward from the wiring pattern 13. Here, as illustrated in FIG. 4A, when using a board 10A to form a batch of semiconductor packages 1, a frame-shaped dam 61 is formed along the contour of the board 10A. The dam 61 is preferably made of a material having high viscosity such as epoxy resin. The dam 61 may be formed by adhering a frame to the board 10A or by forming such a frame by performing a process for manufacturing a glass epoxy substrate (photolithography process or printing process).

Figure 4B:
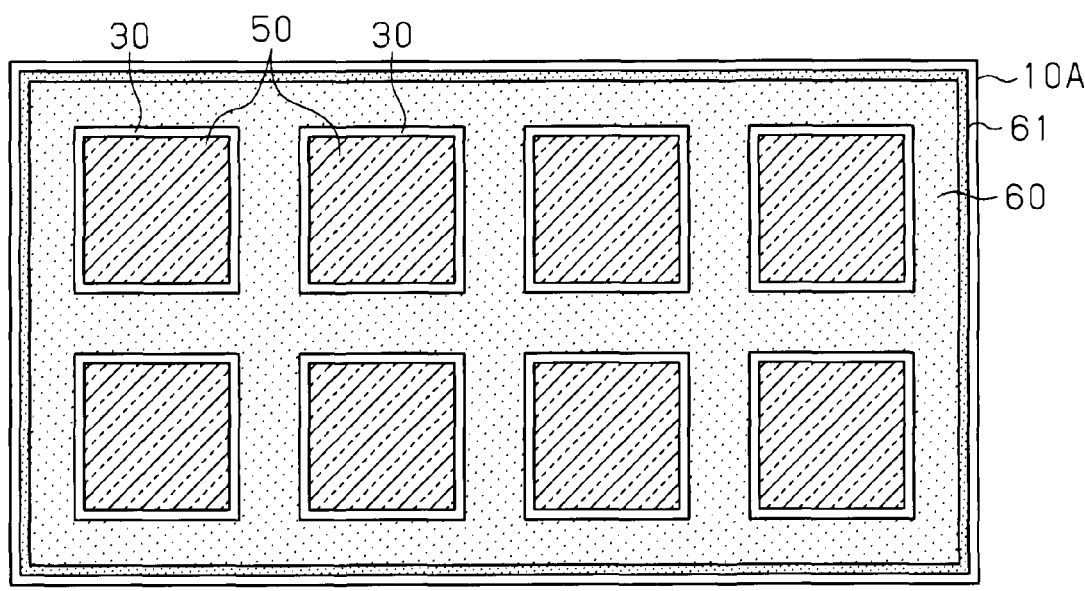

Next, referring to FIG. 4B, a potting process is performed to fill a potting resin in the region surrounded by the dam 61. Then, the resin is heated and hardened to form the molding resin 60. Referring to FIG. 3B, the molding resin 60 fills the gap between the lower surfaces of the adhesion portion 32 and upright portion 33 in the enclosing frame 30 and the imaging element 20 and the wiring board 10. As a result, as illustrated in FIG. 3B, the molding resin 60 supports the enclosing frame 30 and seals the wiring pattern 13, the connection pads 21, and the wires 22. In this process, the dam 61 functions to dam the resin of the molding resin 60.

Then, referring to FIG. 3C, the structure illustrated in FIG. 3B is diced along a dicing line B to obtain a plurality of semiconductor packages 1.

The present embodiment has the advantages described below.

(1) The enclosing frame 30 of the semiconductor package 1 is arranged on the imaging element 20. Thus, there is no need to provide space on the wiring board 10 for arrangement of the enclosing frame 30. This allows the wiring board 10 to be reduced in size accordingly, and the semiconductor package 1 can be miniaturized. Further, the molding resin 60, which fills the gap between the adhesion portion 32, the wiring board 10, and the imaging element 20, contacts the lower surface of the adhesion portion 32 and supports the enclosing frame 30. The adhesion of the basal portion 31 and imaging element 20 with the adhesive agent 23 and the support of the enclosing frame 30 results in the enclosing frame 30 being rigidly supported.

(2) The adhesion portion 32 includes the recess 32X formed in its upper surface 32A. The adhesive agent 40 is applied to the upper surface 32A of the adhesion portion 32 and filled in the recess 32X. In this manner, the adhesive agent 40, which has a lower coefficient of elasticity than the cap 50, can be thickened by filling the adhesive agent 40 in the recess 32X. As a result, when performing a heat treatment on the semiconductor package 1, elastic deformation of the adhesive agent 40 absorbs the difference in thermal expansion coefficients of the enclosing frame 30 and the cap 50. This reduces thermal stress that would be caused by the difference between the thermal expansion coefficients and suppresses bending and the like of the cap 50.

(3) The recess 32X is frame-shaped. As a result, the recess 32X is evenly formed in the upper surface 32A of the adhesion portion 32. This effectively suppresses bending of the cap 50.

It should be apparent to those skilled in the art that the present invention may be embodied in many other specific forms without departing from the spirit or scope of the invention. Particularly, it should be understood that the present invention may be embodied in the following forms.

In the above embodiment, after the enclosing frame 30 is adhered to the imaging element 20, the cap 50 is adhered to the enclosing frame 30. Instead, for example, the enclosing frame 30 may be adhered to the imaging element 20 after the cap 50 is adhered to the enclosing frame 30. In this case, the semiconductor package 1 is manufactured in the following manner.

Figure 5A:
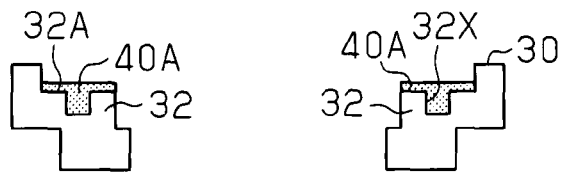
FIGS. 5A to 5D are schematic cross-sectional views illustrating the procedures for manufacturing a semiconductor package of a first modification.

Referring to FIG. 5A, before the enclosing frame 30 is adhered to the imaging element 20, an adhesive agent 40A is filled in the recess 32X in the adhesion portion 32 of the enclosing frame 30. The adhesive agent 40A is also applied to the upper surface 32A of the adhesion portion 32. A thermosetting adhesive agent may be used as the adhesive agent 40A. An epoxy or urethane adhesive agent may be used as the thermosetting adhesive agent.

Figure 5B:
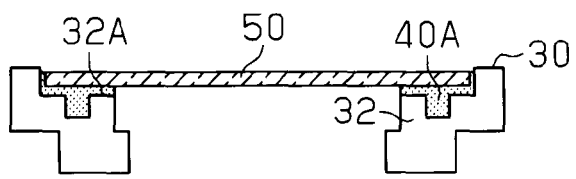

Referring to FIG. 5B, the cap 50, which is slightly smaller than the contour of the adhesion portion 32 in the enclosing frame 30, is arranged on the upper surface 32A of the adhesion portion 32. Then, a heat treatment is performed under a predetermined temperature (e.g., approximately 85° C.) to harden the adhesive agent 40A. As a result, the cap 50 is adhered to the upper surface of the enclosing frame 30.

Figure 5C:
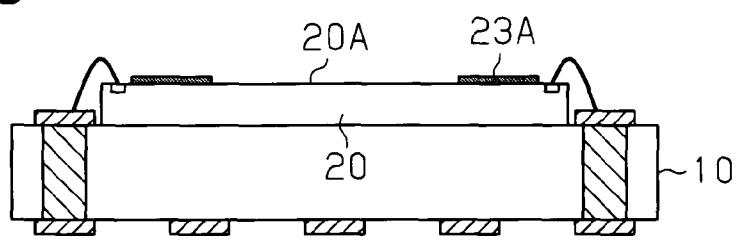

Referring to FIG. 5C, an adhesive agent 23A is applied to the upper surface 20A of the imaging element 20, which is mounted on the wiring board 10, in the form of a frame along the peripheral surface of the imaging element 20. A thermosetting and UV curing adhesive agent may be used as the adhesive agent 23A. An epoxy or acrylic adhesive agent may be used as such a thermosetting and UV curing adhesive agent.

Figure 5D:
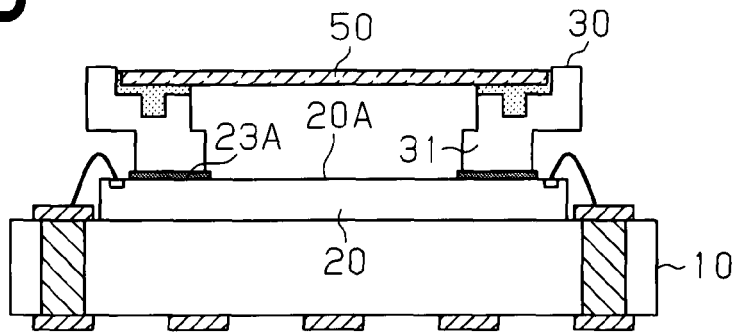

Then, referring to FIG. 5D, the enclosing frame 30, to which the cap 50 is adhered, is arranged on the imaging element 20. More specifically, the enclosing frame 30 is arranged on the imaging element 20 so that the bottom surface of the basal portion 31 of the enclosing frame 30 comes into contact with the adhesive agent 23A. The adhesive agent 23A is partially hardened when irradiated with UV light and then completely hardened when undergoing a heat treatment under a predetermined temperature (e.g., approximately 85° C.). As a result, the enclosing frame 30, to which the cap 50 is adhered, is adhered to the upper surface 20A of the imaging element 20.

The subsequent manufacturing procedures are the same as those illustrated in FIGS. 3A to 3C and will not be described here.

Figure 6:
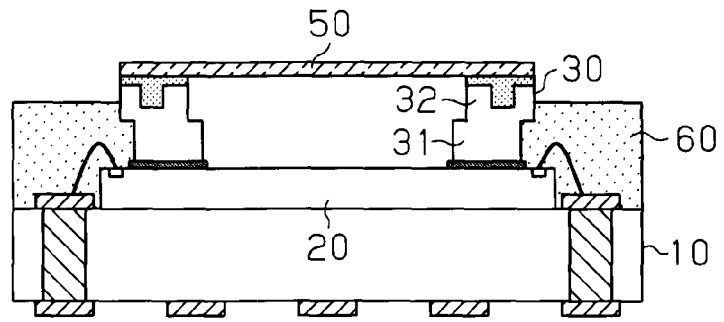
FIG. 6 is a schematic cross-sectional view illustrating a semiconductor package of a second modification.

As illustrated in FIG. 6, the upright portion 33 may be omitted from the enclosing frame 30.

Figure 7:
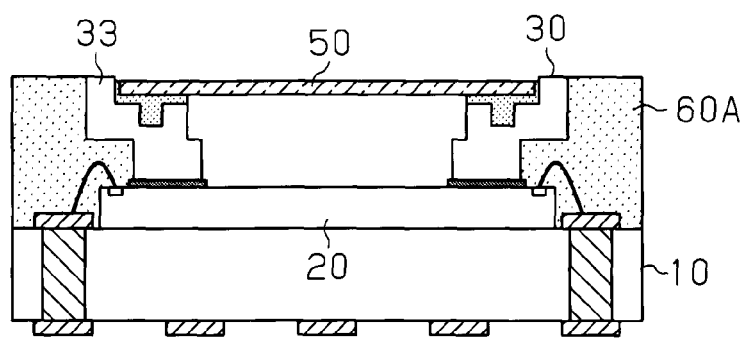
FIG. 7 is a schematic cross-sectional view illustrating a semiconductor package of a third modification.

In the above embodiment, a potting resin obtained through a potting process is used to form the molding resin 60. Instead, referring to FIG. 7, a molding resin obtained through a transfer molding process, a compression molding process, an injection molding process, or the like may be used to form the molding resin 60A. In the example of FIG. 7, the molding resin 60A is formed so that the upper surface of the molding resin 60A is flush with the upper surface of the upright portion 33.

Figure 8:
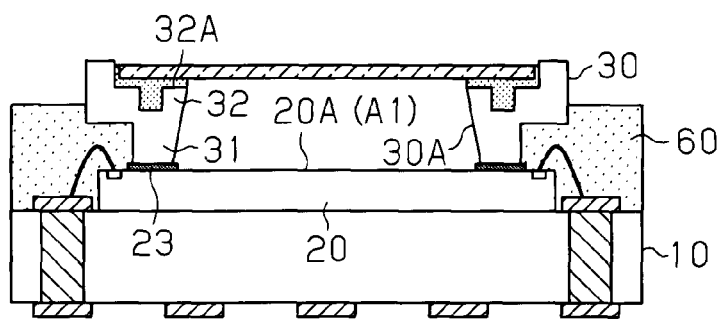
FIG. 8 is a schematic cross-sectional view illustrating a semiconductor package of a fourth modification.

Referring to FIG. 8, an inner surface 30A of the enclosing frame 30 (basal portion 31 and adhesion portion 32) may be tapered from the bottom surface of the basal portion 31 to the upper surface 32A of the adhesion portion 32. This decreases the bottom surface area of the basal portion 31 arranged on the upper surface 20A of the imaging element 20 and reduces the area to which the adhesive agent 23 is applied for the adhesion of the imaging element 20 and the enclosing frame 30. Accordingly, the adhesive agent 23 is prevented in a preferable manner from spreading to the effective pixel region A1 of the imaging element 20.

Figure 9:
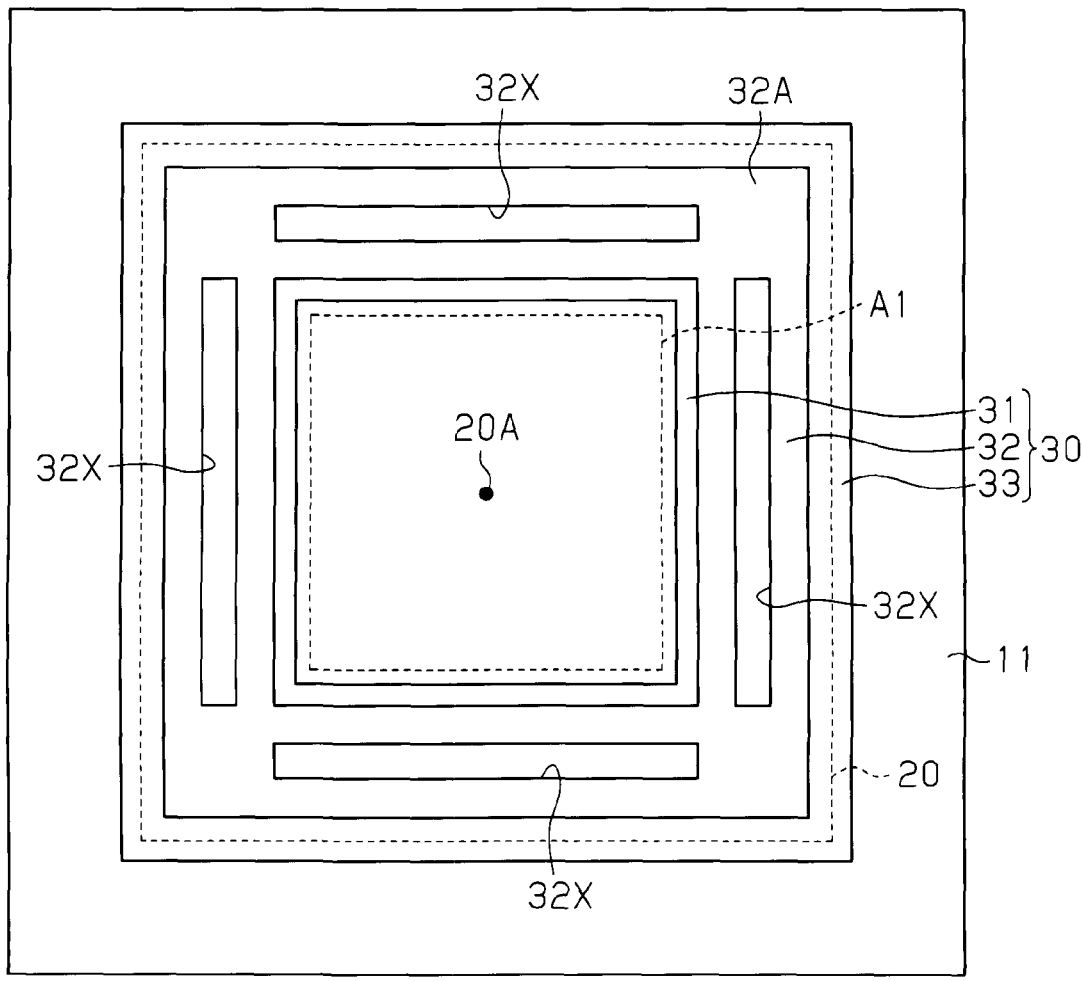
FIG. 9 is a schematic plan view illustrating a semiconductor package of a fifth modification without a cap.
Figure 10:
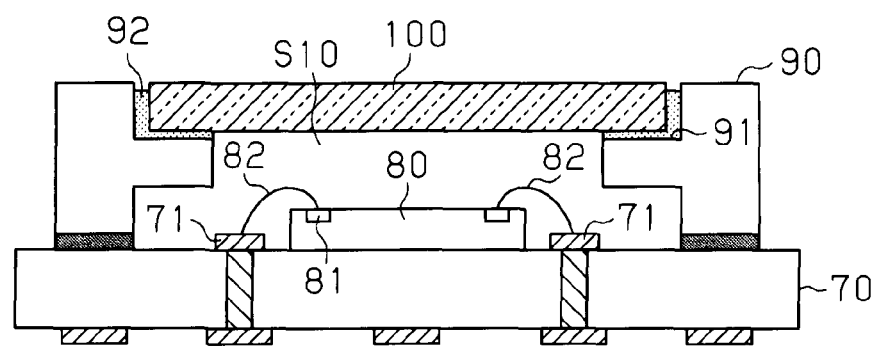
FIG. 10 is a schematic cross-sectional view illustrating a semiconductor package of the prior art.

In the above embodiment, the recess 32X of the adhesion portion 32 has the shape of a closed frame but is not limited to such a shape. For example, as illustrated in FIG. 9, straight recesses 32X may be formed at four sides in the upper surface 32A of the adhesion portion 32 in the enclosing frame 30. Alternatively, the recesses 32X may be scattered in the upper surface 32A of the adhesion portion 32.

In the above embodiment, the enclosing frame 30 is formed by integrally molding the basal portion 31, the adhesion portion 32, and the upright portion 33. For example, the basal portion 31, adhesion portion 32, and upright portion 33 may be adhered with an adhesive agent or the like to form the enclosing frame 30.

In the above embodiment, the imaging element 20 is arranged on the wiring board 10. However, electronic components other than the imaging element 20 may be arranged on the wiring board 10. For example, an optical semiconductor element may be mounted on the wiring substrate. A planar light emission semiconductor laser or a light reception element (photodiode) may be used as the optical semiconductor element.

All examples and conditional language recited herein are intended for pedagogical purposes to aid the reader in understanding the principles of the invention and the concepts contributed by the inventor to further the art, and are to be construed as being without limitation to such specifically recited examples and conditions, nor does the organization of such examples in the specification relate to a illustrating of the superiority and inferiority of the invention. Although the embodiment of the present invention has been described in detail, it should be understood that the various changes, substitutions, and alterations could be made hereto without departing from the spirit and scope of the invention.

The invention claimed is:
1. A semiconductor package comprising:
  a wiring board;
  an electronic component mounted on the wiring board;
  an enclosing frame arranged on an upper surface of the electronic component, wherein the enclosing frame includes a basal portion, which has the form of a closed frame and extends along the upper surface of the electronic component, and an adhesion portion, which is wider than the basal portion and is arranged on the upper surface of the basal portion, wherein the basal portion of the enclosing frame is adhered to the upper surface of the electronic component, and the adhesion portion includes a lower surface arranged above and outward from the basal portion;

a cap arranged on and adhered to an upper surface of the adhesion portion, wherein the upper surface of the adhesion portion on which the cap is arranged is wider than the basal portion; and a molding resin that contacts the lower surface of the adhesion portion and seals the electronic component and the wiring board that are exposed from the enclosing frame.

2. The semiconductor package according to claim 1, wherein the upper surface of the adhesion portion includes a recess, and the cap is adhered by an adhesive agent, which is applied to the upper surface and recess of the adhesion portion, to the upper surface of the adhesion portion.

3. The semiconductor package according to claim 2, wherein the adhesion portion has the form of a closed frame, and the recess has the form of a closed frame and extends along a contour of the adhesion portion.

4. The semiconductor package according to claim 1, wherein the basal portion projects inward from the adhesion portion to form a stepped portion in an inner surface of the enclosing frame.

5. The semiconductor package according to claim 1, wherein the enclosing frame includes an inner surface formed by inclined inner surfaces of the adhesion portion and the basal portion defining a central opening having an inner dimension that continuously decreases from the basal portion toward the upper surface of the adhesion portion.

6. The semiconductor package according to claim 1, wherein the enclosing frame includes an upright portion arranged on a periphery of the adhesion portion to surround the cap.

7. The semiconductor package according to claim 1, wherein at least one of adhesive agents adhering the adhesion portion and the cap and adhering the electronic component and the enclosing frame is a thermosetting and ultraviolet curing adhesive agent.

8. The semiconductor package according to claim 1, wherein the molding resin fills a gap defined at least by the lower surface of the adhesion portion, a surface of the electronic component exposed from the enclosing frame, and a surface of the wiring board exposed from the electronic component.

9. The semiconductor package according to claim 1, wherein the electronic component is an imaging element, and the cap is made of glass.

10. A semiconductor package comprising:
a wiring board;
an imaging element mounted on the wiring board and including an effective pixel region and an ineffective pixel region, which is located outward from the effective pixel region;
an infrared cut filter that covers at least the effective pixel region of the imaging element;
an enclosing frame mounted on the ineffective pixel region of the imaging element, wherein the enclosing frame supports the infrared cut filter at a height distanced from the ineffective pixel region of the imaging element, wherein the enclosing frame includes
a bottom surface adhered to the ineffective pixel region of the imaging element,
an upper surface to which a periphery of the infrared cut filter is entirely adhered, and
a side surface including an outer step, wherein
the enclosing frame cooperates with the infrared cut filter to define a sealed void that entirely accommodates the effective pixel region of the imaging element, and
an adhesion interface of the infrared cut filter and the upper surface of the enclosing frame has a greater width than an adhesion interface of the imaging element and the bottom surface of the enclosing frame; and
a resin mold that fills a gap defined at least by the outer step of the enclosing frame, a contour of the imaging element, and the wiring board to cover a wire electrically connecting the imaging element and the wiring board and to support the enclosing frame.

11. The semiconductor package according to claim 1, wherein the adhesion portion projects upward so that the upper surface of the adhesion portion is located above the molding resin.

12. The semiconductor package according to claim 6, wherein the upright portion projects upward so that an uppermost part of the upright portion is located above the molding resin.

13. The semiconductor package according to claim 1, wherein the cap has a planar member.

14. The semiconductor package according to claim 13, wherein the cap cooperates with the upper surface of the electronic component and the basal portion and the adhesion portion of the enclosing frame to define a single, sealed void.

15. The semiconductor package according to claim 1, wherein the basal portion includes an outer surface that contacts the molding resin, and the upper surface of the adhesion portion includes an outer edge located outward relative to the outer surface of the basal portion and an inner edge located inward relative to the outer surface of the basal portion.

16. The semiconductor package according to claim 15, wherein the outer surface of the basal portion is located outward relative to the inner edge of the upper surface of the adhesion portion by a first distance that is greater than a second distance between the outer surface of the basal portion and the outer edge of the upper surface of the adhesion portion.

17. The semiconductor package according to claim 2, wherein the recess of the adhesive portion is located directly above a bottom surface of the basal portion.

* * * * *